United States Patent [19]

La Fetra et al.

[11] Patent Number: 5,029,133

[45] Date of Patent: Jul. 2, 1991

[54] VLSI CHIP HAVING IMPROVED TEST ACCESS

[75] Inventors: Ross V. La Fetra, Cupertino; Lee Fleming, Fremont, both of Calif.

[73] Assignee: Hewlett-Packard Company, Palo Alto, Calif.

[21] Appl. No.: 575,086

[22] Filed: Aug. 30, 1990

[51] Int. Cl.[5] .............................................. G11C 7/00
[52] U.S. Cl. ............................... 365/189.02; 365/201; 371/3; 371/72.3
[58] Field of Search ............... 365/201, 189.02; 371/3, 371/22.3

[56] References Cited

U.S. PATENT DOCUMENTS

| | | | |
|---|---|---|---|
| 4,809,273 | 2/1989 | Jackowski et al. | 371/3 |
| 4,903,270 | 2/1990 | Johnson et al. | 371/3 |
| 4,916,700 | 4/1990 | Ito et al. | 365/201 |
| 4,956,818 | 9/1990 | Hatayama et al. | 365/201 |
| 4,980,889 | 12/1990 | Deguise et al. | 371/22.3 |
| 4,982,380 | 1/1991 | Koike | 365/201 |

Primary Examiner—Joseph E. Clawson, Jr.
Attorney, Agent, or Firm—Roland I. Griffin; Alan H. Haggard

[57] ABSTRACT

An improved integrated circuit chip design which is better adapted to testing using existing circuit testers is disclosed. The chip includes a parallel load instruction which reduces the number of words of tester memory needed to load the internal scan registers. The parallel load instruction loads memory cells connected to the input pins of the chip which are then shifted into the scan registers.

2 Claims, 1 Drawing Sheet

VLSI CHIP HAVING IMPROVED TEST ACCESS

FIELD OF THE INVENTION

The present invention relates to integrated circuits, and more particularly, to an improved chip design which is better adapted to automated testing than prior art designs.

BACKGROUND OF THE INVENTION

As integrated circuits have become larger and more complex, a need has arisen for automated testing. It is economically advantageous to construct VLSI chips on production lines that have a yield less than 100%. Hence, some means for testing the output of these lines must be utilized to identify and remove the inoperative chips. In addition, once these chips are incorporated into larger circuits, testing of the larger circuit is often carried out to identify assembly errors.

A VLSI chip may be viewed as consisting of four broad types of circuitry, signal interfaces, logic circuitry for carrying out the normal functions of the chip, logic circuitry for testing the chip, and registers. The signal interfaces receive signals specifying data and operations to be carried out by the chip. In addition, the signal interfaces output signals representing the results of the operations in question. The registers store various results and are used in the calculations performed by the logic circuitry. In general, the registers are isolated from the signal interfaces by the logic circuitry.

The testing of many of the functions performed by the VLSI chip may be more easily conveniently performed if the contents of the registers can be specified and read without utilizing the logic circuitry to load and read these registers. Hence, special purpose testing logic is routinely included in the chip for accessing the registers. The testing logic typically includes circuits for serial loading and unloading the registers. This logic will be referred to as the scan logic in the following discussion. When the registers are loaded and unloaded using the scan logic, several registers may be connected together by the testing logic to form one long shift register. This long shift register will be referred to as a scan register in the following discussion.

The scan logic typically uses 4 pins on the chip. One pin, referred to as the scan input, is used for reading one bit into the first location of a scan register. A second pin, referred to as the scan output, is used for reading out the bit in the last location in a scan register. The third pin, referred to as the mode pin, is used to specify the scan mode for the VLSI chip. The fourth pin receives clock signals which are used in shift operations.

A scan register is typically loaded by shifting the data into the scan register one bit at a time using the scan input to receive the bits. A typical scan register has thousands of bits. Hence, several thousands of shift instructions must be used to load a scan register.

Similarly, a scan register is read by shifting the data out of the scan register one bit at a time using the scan output. Again, several thousands of shift instructions are typically needed to read out a scan register.

The testing functions including the inputting and outputting of data to and from the scan register, are typically carried out with the aid of general purpose integrated circuit testers. A typical integrated circuit tester includes an interface for making connections to the pins on a VLSI chip or circuit board, a memory for storing the signal levels to be applied to these pins, and a data processor for applying the signals in an order determined by a test specified by the circuit designer. The pin interface typically has provisions for 256 pins. Hence, the signal memory is organized as 256 bit data words. The number of memory words is typically in the millions.

In many existing integrated circuit testers, the signal levels must be specified by these large data words. While these data words are well suited for test functions that must access a large fraction of the pins on a VLSI chip, they are poorly suited for the portion of the test related to loading and unloading scan registers. As noted above, a scan register load operation requires thousands of shift instructions which utilize only 4 pins. Hence, the data words for loading and unloading scan registers require the storage of thousands of 256 bit data words in which only 4 of the 256 bits are utilized. This inefficient utilization of the tester memory can limit the tests that can be performed by these existing testers, since the number of memory words that must be devoted to scan register loading and unloading can be a large fraction of the total memory capacity of the tester.

In principle, additional memory could be added to the tester; however, there is a limit on the total memory that can be used in any given tester. Furthermore, the tester memory must be capable of operation at speeds consistent with those at which the VLSI circuit operates. Hence, the memory must be very fast in addition to being very large. As a result, the cost of the memory is a significant fraction of the cost of an integrated circuit tester. Thus, even if the tester memory could be expanded to accommodate the instructions needed to load and unload the scan registers, this approach is economically disadvantageous.

This inefficient use of the tester memory has led to new tester designs in which the memory is divided into words of different length. These testers include a very large number of short data words, e.g. 4 bit data words, for storing the scan instructions. While this approach provides an economically satisfactory solution to the memory efficiency problem, it requires the user to purchase a new tester. The cost of a VLSI tester is many millions of dollars. Hence, it would be advantageous to provide a solution to memory efficiency problem that does not require the user to purchase a new tester.

Broadly, it is an object of the present invention to provide an improved VLSI circuit design which is better adapted to test procedures utilizing scan registers.

It is a further object of the present invention to provide a VLSI circuit design that more efficiently utilizes the memory of existing VLSI testers.

These and other objects of the present invention will become apparent to those skilled in the art from the following detailed description of the present invention and the accompanying drawings.

SUMMARY OF THE INVENTION

An integrated circuit according to the present invention includes an input shift chain that can be loaded in parallel from a single tester memory word and a means for transferring the data in the input shift chain to the scan registers of the circuit. The input shift chain includes a plurality of input circuits arranged in an ordered linear array including a first input circuit, one or more intermediate input circuits, and a last input circuit. Each said input includes an external connection means, a memory means, and multiplexer means. The external connection means provide a means for receiving an external signal specifying one bit of information to the circuit. The memory means include means for storing one bit of information specified by an input signal on a memory input thereto, said bit of information being stored in response to a clock signal. The signal generating means generates a signal indicative of the bit of information currently stored in said memory means. The multiplexer means includes first and second inputs, a control input, and a multiplexer output. The first input is connected to said external connection means, and the second input is connected to said generating means in the memory means prior to said memory means in said ordered linear array, and said multiplexer output being connected to said memory input. The multiplexing means connects the first input to the multiplexer output if a first control signal is present on the control input, and the multiplexer means connects the second input to said multiplexer output if a second control signal is present on said control input. The integrated circuit also includes a scan register comprising a shift register, the shifting operations thereof being responsive to said clock signal. The signal generating means of said last input means is connected to the input of said shift register. A control means, responsive to one or more external control signals, generates said first and second control signals without altering the contents of said scan register and couples said first and second signals to each said multiplexer means.

DETAILED DESCRIPTION OF THE INVENTION

Figure 1:
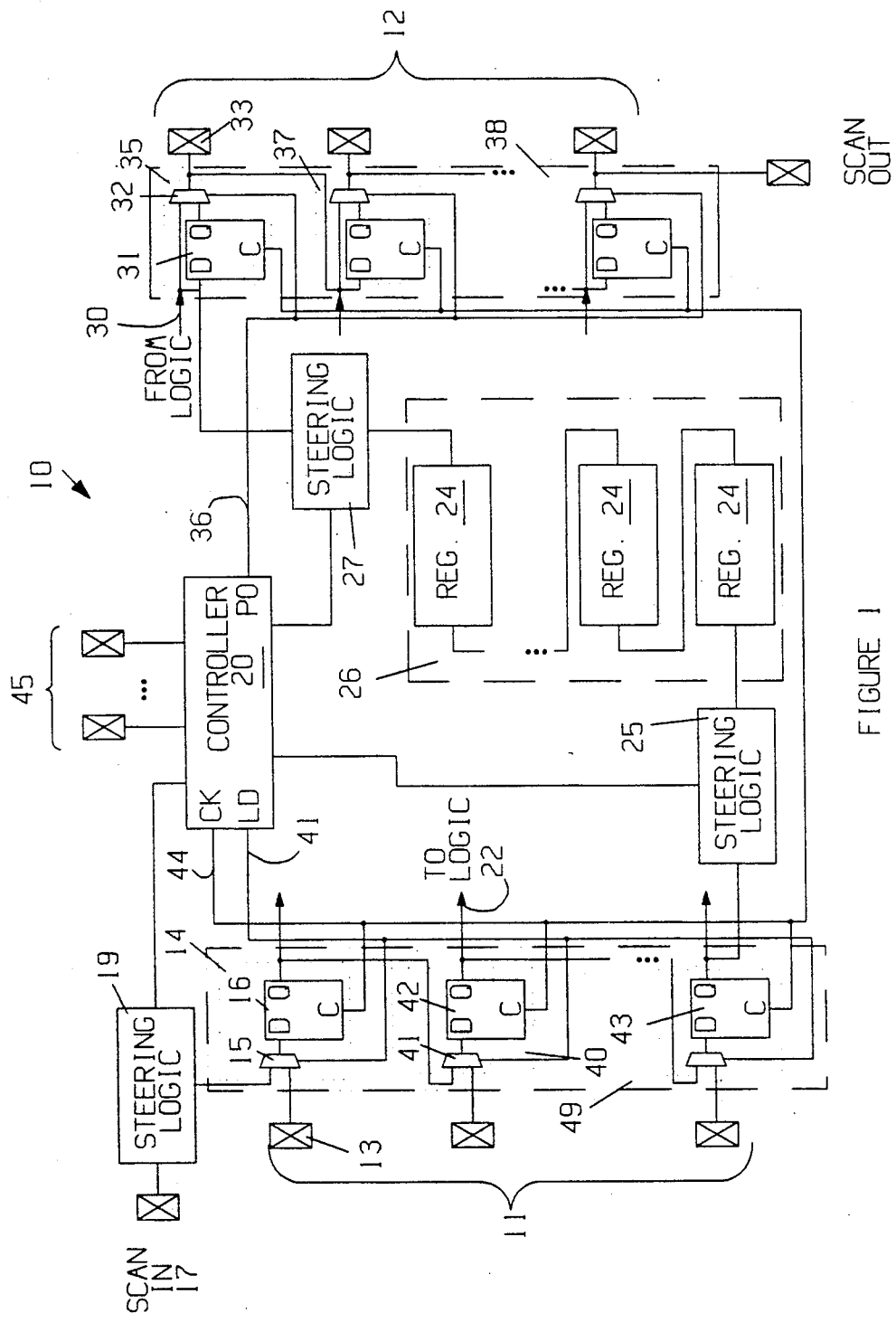
FIG. 1 is a block diagram of a portion of an integrated circuit according to the present invention.

The manner in which the present invention obtains its advantages can be more easily understood with reference to FIG. 1 which is a block diagram a chip 10 according to the present invention. To simplify the figure, only those features of chip 10 which relate to the present invention are shown. Chip 10 includes a plurality of input pins 11 and a plurality of output pins 12. A typical input pin is shown at 13. Each input pin is connected to an input memory circuit. Typical input memory circuits are shown at 14 and 40.

The manner in which the input memory circuits operate may be more easily understood by examining memory cells 14 and 40 and the manner in which said input memory circuit are connected. Each input memory circuit includes a multiplexer and an input memory cell. For example, input memory cell 14 includes multiplexer 15 and input memory cell 16. Input memory cell 16 is a conventional memory cell which can be connected in series with other input memory cells to form an input shift register 49. In such a shift register the Q output of one input memory cell is connected to the D input of a second input memory cell.

The multiplexer in each input memory circuit provides one of two connection states. In the first connection state, the D input of the input memory cell is connected to the pin connected to the input memory circuit. In the second connection state, the D input of the input memory cell is connected to the Q output of the previous input memory circuit in shift chain 49. The connection state is specified by a signal having one of two possible states on a signal line 41. This signal will be referred to as the LD signal in the following discussion As can be seen form FIG. 1, input memory cell 16 in input memory circuit 14 can be connected to input memory cell 42 in input memory circuit 40 by applying the appropriate LD signal on line 41. This signal is generated by a controller 20 in response to signals on control pins 45.

Each of the input memory cells is also connected to the internal logic of chip 10 as indicated by the arrows leaving the Q output of each of the input memory cells. A typical arrow is shown at 22. These connections allow the normal functions of the chip to operate when the chip is not in the test mode. In addition, each of the input pins may be directly connected to the internal logic of the chip. To simplify the figure, such direct connections have been omitted.

Data may be placed into the input memory cells by either of two methods. First, the data may be placed on the input pins 11 and then read into the input memory cells. This is the preferred method of inputting the data since all of the input memory cells are loaded at once. In the second method, the data to be inputted to the input memory cells is shifted into the cells one bit at a time by placing the desired value on the SCAN IN pin 17. The SCAN IN pin is connected to the scan chain via steering logic 19 which is under the control of controller 20. Steering logic 19 may also be used to steer the data on the SCAN IN pin 17 to controller 20. This later mode of operation may be used to input instructions to controller 20.

Chip 10 incudes a plurality of internal registers 24 which may be connected together to form a scan register 26. The connection of the registers 24 to form scan register 26 is carried out by controller 20 in response to signals on the control pins 45. The circuitry for making these connections is conventional in the art, and hence, has been omitted to simplify the figure.

Data stored in the input memory cells may be transferred to scan register 26. The last input memory cell 43 in the input scan chain is connected to the first register in scan register 26 via steering logic 25 which is under the control of controller 20. When so connected, each time the input shift chain 49 is shifted, the value in memory cell 43 is shifted into scan register 26.

The present invention allows scan register 26 to be loaded in a more efficient manner than prior art chips. As noted above, prior art chip designs have a test mode in which the scan registers are loaded one bit at a time from the SCAN IN pin. Such designs require one word of tester memory per bit even though only a fraction of the tester memory word is utilized. In the present invention, one word of tester memory is utilized to load all of the input memory cells using a single parallel load test instruction. The contents of the input memory cells are then shifted into scan register 26 utilizing a tester subroutine. The tester subroutine requires only a small number of memory words, since it does not need to supply the data being shifted into scan register 26. This subroutine need only supply a number of input scan register "shift" instructions to controller 20.

The above described procedure will be referred to as a "parallel load" instruction. If the number of bits in scan register 26 is greater than the number of input pins 11, a plurality of parallel load instructions are used to load scan register 26. Each parallel load instruction consists of an instruction requiring one tester memory word specifying the values to be loaded into the input memory cells followed by N shift instructions. Here, N is the number of input memory cells having values which are to be entered into scan register 26. The number of bits in the memory word used to load the input memory cells is much greater than that used in prior art designs. Hence, a much smaller number of tester memory words is needed to load scan register 26 than would be needed if prior art chip designs were utilized.

It should be noted that the instruction immediately following a parallel load instruction will always be the first shift instruction needed to move the contents of input shift register 49 into scan register 24. Hence, in the preferred embodiment of the present invention, a parallel load instruction terminates with a shift instruction thereby saving one shift instruction.

In the preferred embodiment of the present invention, the output pins 12 are connected to output memory circuits which are analogous to input memory circuits described above. A typical output memory circuit is shown in FIG. 1 at 35. Output memory circuit 35 is connected to output pin 33. Output memory circuit 35 includes a memory cell 31 and a multiplexer 32. Multiplexer 32 connects either the Q output of memory cell 31 or the value on line 30 to pin 33 depending on the signal level on bus 36. The signals on line 30 is derived from the internal chip logic. In normal operation, these signals are the ones presented to the output pins. During testing, the values in the memory cells are typically used.

The memory cells in the output memory circuits can also be connected to form a shift chain 38. Such connections are specified by the signal on bus 36. When so connected, the Q output of each memory cell provides the D input to the next memory cell in shift chain 38. The input to the first memory cell 31 in the shift chain is derived from the scan register 26 through steering logic 27 which is under the control of controller 20.

Shift chain 38 may be used to output the values in scan register 26 in parallel thereby reducing the number of tester memory words needed to read out the contents of scan register 26. In this mode, the contents of scan register 20 are shifted into shift chain 38 by applying the appropriate signals on line 36 and clock pulses on line 47. The shift chain is then read out in parallel on output pins 12 into one word of tester memory. If scan register 26 includes more bits than can be loaded in shift chain 38, then multiple load and read out instructions are used in a manner analogous to that described above with reference to loading scan register 26.

It should be noted that prior art chip designs include memory circuits similar to those described above with reference to the present invention. Such circuitry is common in chips having boundary scan. However, prior art designs only allow the input memory cells to be loaded in parallel via instructions which are used in normal chip operation. Such instructions alter the contents of the scan registers and/or other internal registers in the chip, and hence, are not suitable for loading the scan register.

There has been described herein a novel VLSI chip design which more efficiently utilizes the memory capacity of existing VLSI test equipment. Various modifications to the present invention will become apparent to those skilled in the art from the foregoing description and accompanying drawings. Accordingly, the present invention is to be limited solely by the scope of the following claims.

What is claimed is:

1. An integrated circuit comprising:

input shift chain means comprising a plurality of input means arranged in an ordered linear array including a first input means, one or more intermediate input means, and a last input means, each said input means comprising external connection means, memory means, and multiplexer means, said external connection means including means for receiving an external signal specifying one bit of information, said memory means comprising means for storing one bit of information specified by an input signal on a memory input thereto, said bit of information being stored in response to a clock signal, and signal generating means for generating a signal indicative of said bit of information currently stored in said memory means; and said multiplexer means comprising first and second inputs, a control input, and a multiplexer output, said first input being connected to said external connection means, said second input being connected to said generating means in the memory means prior to said memory means in said ordered linear array, and said multiplexer output being connected to said memory input, said multiplexing means connecting said first input to said multiplexer output if a first control signal is present on said control input and said multiplexer means connecting said second input to said multiplexer output if a second control signal is present on said control input;

said integrated circuit further comprising:

scan register means comprising a shift register, the shifting operations thereof being responsive to said clock signal;

means for connecting said signal generating means of said last input means to the input of said shift register; and control means responsive to one or more external control signals for generating said first and second control signals without altering the contents of said scan register and coupling said first and second signals to each said multiplexer means.

2. The integrated circuit of claim 1 wherein said control means further comprises means for generating said first control signal, said second control signal, and then said clock signal.

* * * * *